(12) United States Patent
Huang et al.

(10) Patent No.: US 11,569,162 B2
(45) Date of Patent: *Jan. 31, 2023

(54) CHIP ON FILM PACKAGE WITH REINFORCING SHEET AND MANUFACTURING METHOD OF CHIP ON FILM PACKAGE WITH REINFORCING SHEET

(71) Applicant: Novatek Microelectronics Corp., Hsinchu (TW)

(72) Inventors: Chiao-Ling Huang, Hsinchu (TW); Tai-Hung Lin, Hsinchu (TW)

(73) Assignee: Novatek Microelectronics Corp., Hsinchu (TW)

(*) Notice: Subject to any disclaimer, the term of this patent is extended or adjusted under 35 U.S.C. 154(b) by 165 days.

This patent is subject to a terminal disclaimer.

(21) Appl. No.: 16/988,741

(22) Filed: Aug. 10, 2020

(65) Prior Publication Data

US 2021/0098345 A1 Apr. 1, 2021

Related U.S. Application Data

(63) Continuation of application No. 15/821,846, filed on Nov. 24, 2017, now Pat. No. 10,777,498.

(60) Provisional application No. 62/551,755, filed on Aug. 29, 2017.

(51) Int. Cl.
*H01L 23/498* (2006.01)
*H01L 23/00* (2006.01)
*H01L 21/48* (2006.01)
*H01L 23/12* (2006.01)

(52) U.S. Cl.
CPC ...... *H01L 23/4985* (2013.01); *H01L 21/4846* (2013.01); *H01L 23/12* (2013.01); *H01L 23/562* (2013.01); H01L 2224/16225 (2013.01); H01L 2224/32225 (2013.01); H01L 2224/73204 (2013.01)

(58) Field of Classification Search
None
See application file for complete search history.

(56) References Cited

U.S. PATENT DOCUMENTS

2003/0109669 A1* 6/2003 Sadanobu ............. B29D 7/01
528/170
2005/0110049 A1* 5/2005 Urushido ............. H05K 1/0281
257/202
2006/0068164 A1* 3/2006 Iguchi ............. H05K 1/0259
428/209
2006/0289939 A1* 12/2006 Kim ............. G02F 1/136204
257/368

(Continued)

*Primary Examiner* — Lex H Malsawma
(74) *Attorney, Agent, or Firm* — JCIPRNET (57) ABSTRACT

A chip on film package includes a base film, a patterned circuit layer, a chip and a reinforcing sheet. The base film includes a first surface, a second surface opposite to the first surface and a mounting region located on the first surface. The patterned circuit layer is disposed on the first surface. The chip is mounted on the mounting region and electrically connected to the patterned circuit layer. The reinforcing sheet is disposed on the first surface and/or the second surface and exposes the chip, wherein a flexibility of the reinforcing sheet is substantially equal to or greater than a flexibility of the base film.

28 Claims, 4 Drawing Sheets

(56) References Cited

U.S. PATENT DOCUMENTS

| | | | |
|---|---|---|---|
| 2007/0007649 A1* | 1/2007 | Lu | H01L 23/3735 257/E23.005 |
| 2008/0078491 A1* | 4/2008 | Saimen | B32B 37/003 156/60 |
| 2008/0116561 A1* | 5/2008 | Liu | H01L 21/563 257/E21.503 |
| 2011/0050657 A1* | 3/2011 | Yamada | H01L 27/3293 361/679.01 |
| 2013/0148312 A1* | 6/2013 | Han | H05K 1/028 361/736 |
| 2014/0306348 A1* | 10/2014 | Ahn | H05K 1/0281 257/773 |
| 2018/0102312 A1* | 4/2018 | Pun | H01L 23/49894 |

\* cited by examiner

CHIP ON FILM PACKAGE WITH REINFORCING SHEET AND MANUFACTURING METHOD OF CHIP ON FILM PACKAGE WITH REINFORCING SHEET

CROSS-REFERENCE TO RELATED APPLICATION

This is a continuation application of patent application Ser. No. 15/821,846, filed on Nov. 24, 2017, which claims the priority benefit of U.S. provisional application Ser. No. 62/551,755, filed on Aug. 29, 2017 and is now allowed. The entirety of the above-mentioned patent application is hereby incorporated by reference herein and made a part of this specification.

BACKGROUND

1. Technical Field

The present disclosure generally relates to a chip package and a manufacturing method of the chip package, in particular, to a chip on film package and a manufacturing method of the chip on film package.

2. Description of Related Art

To expand the market area of display devices such as liquid crystal displays (LCDs), with promotion of low cost, large scale, and high performance, more pixels have to be integrated in a small area. Thus, as a lead pitch of a driver integrated circuit (IC) which controls each pixel becomes finer within the display device, various packaging methods have been developed.

Packaging methods mainly used in a display device field include a tape carrier packaging (TCP) method, a chip on glass (COG) packaging method, a chip on film (COF) packaging method, and the like. These methods are referred to as wireless methods. To promote reduction in fabrication cost and improvement in yield due to a fine pitch, the share of COF technology in the packaging market has gradually increased since the late 1990s.

Since COF technology uses a base film on which fine wiring patterns are formed, the distance and pitch between neighboring leads can be minimized, thus maximizing lead density. Further, this COF technology can employ semiconductor chips with a large number of chip pads and fine pitch or large-sized semiconductor chips. Therefore, the COF technology using the base film achieves high-integrated and multi-functional semiconductor device.

The COF package has an excellent bending force and a good flexibility, compared to the conventional chip package, is of high quality. However, as the demand for the IC packages of higher performances increases, the external terminals of such IC package are required not only to be increased in number but also to be more fine pitch. As the level of the fine pitch of the external contacts of the IC package rises, naturally it becomes necessary for the circuits on the base film of COF package to have fine pitch contacts in order to electrically connect the external terminals of the IC package. The thickness of the fine-pitch circuit is also reduces accordingly, which makes the fine-pitch circuit more vulnerable and easier to break.

SUMMARY

Accordingly, the present disclosure is directed to a chip on film package and a manufacturing method of the chip on film package with favourable yield rate.

The present disclosure provides a chip on film package includes a base film, a patterned circuit layer, a chip and a reinforcing sheet. The base film includes a first surface, a second surface opposite to the first surface and a mounting region located on the first surface. The patterned circuit layer is disposed on the first surface. The chip is mounted on the mounting region and electrically connected to the patterned circuit layer. The reinforcing sheet is disposed on the first surface and/or the second surface and exposes the chip, wherein a flexibility of the reinforcing sheet is substantially equal to or greater than a flexibility of the base film.

According to an embodiment of the present disclosure, the reinforcing sheet is disposed on the first surface and includes a first opening exposing the chip.

According to an embodiment of the present disclosure, the reinforcing sheet directly disposed on the patterned circuit layer and the first opening exposes a part of the patterned circuit layer where the chip is mounted.

According to an embodiment of the present disclosure, the chip on film package further includes a solder resist layer disposed on the patterned circuit layer and including a second opening exposing a part of the patterned circuit layer where the chip is mounted, the reinforcing sheet is disposed on the solder resist layer and exposes the second opening.

According to an embodiment of the present disclosure, a size of the reinforcing sheet is substantially smaller than a size of the solder resist layer, and a gap maintains between an outer edge of the reinforcing sheet and an outer edge of the solder resist layer.

According to an embodiment of the present disclosure, the chip on film package further includes an underfill disposed between the chip and the base film and covering the patterned circuit layer exposed by the first opening.

According to an embodiment of the present disclosure, the reinforcing sheet is disposed on the second surface.

According to an embodiment of the present disclosure, the reinforcing sheet includes a plurality of chamfered corners.

According to an embodiment of the present disclosure, the chip on film package further includes an adhesive layer disposed between the reinforcing sheet and the base film.

According to an embodiment of the present disclosure, the patterned circuit layer includes a plurality of circuit lines and a fine-pitch region, and the reinforcing sheet covers the circuit lines in the fine-pitch region.

According to an embodiment of the present disclosure, a pitch between adjacent two of the circuit lines in the fine-pitch region is substantially smaller than 20 μm, and a width of each of the circuit lines ranges from 5 μm to 11 μm.

According to an embodiment of the present disclosure, a material of the reinforcing sheet includes polyimide (PI).

According to an embodiment of the present disclosure, a thickness of the reinforcing sheet ranges from 3 μm to 40 μm.

The present disclosure provides a manufacturing method of a chip on film package. The method includes the following steps. A base film is provided, wherein the base film includes a first surface, a second surface opposite to the first surface and a mounting region located on the first surface. A patterned circuit layer is formed on the first surface. A chip is mounted on the mounting region, wherein the chip is electrically connected to the patterned circuit layer. A reinforcing sheet is laminated onto the first surface and/or the second surface, wherein a flexibility of the reinforcing sheet is substantially equal to or greater than a flexibility of the base film.

According to an embodiment of the present disclosure, the reinforcing sheet is laminated onto the first surface and/or the second surface before the chip is mounted on the mounting region, and the reinforcing sheet covers patterned circuit layer and exposing the mounting region.

According to an embodiment of the present disclosure, the reinforcing sheet is laminated onto the second surface after the chip is mounted on the mounting region.

According to an embodiment of the present disclosure, the reinforcing sheet is laminated onto the first surface and/or the second surface by a laminating roller configured to roll over the first surface and/or the second surface.

According to an embodiment of the present disclosure, the step of laminating the reinforcing sheet onto the first surface and/or the second surface further includes a heating process.

According to an embodiment of the present disclosure, a heating temperature of the heating process ranges from 80° C. to 170° C., and a heating period of the heating process ranges from 1 minute to 60 minutes.

According to an embodiment of the present disclosure, the manufacturing method of the chip on film package further includes the following steps. An adhesive layer is formed on the first surface and/or the second surface before the reinforcing sheet is laminated onto the first surface and/or the second surface.

In light of the foregoing, in the chip on film package of the disclosure, the reinforcing sheet is disposed on the first surface and/or the second surface of the base film and exposes the chip on the base film. Moreover, the flexibility of the reinforcing sheet is substantially equal to or greater than the flexibility of the base film to provide flexibility and protection to the patterned circuit layer on the base film, so as to avoid fracture of fine circuit lines of the patterned circuit layer. Therefore, yield rate of the chip on film package is significantly improved.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Reference will now be made in detail to the present preferred embodiments of the disclosure, examples of which are illustrated in the accompanying drawings. Wherever possible, the same reference numbers are used in the drawings and the description to refer to the same or like parts.

Figure 1:
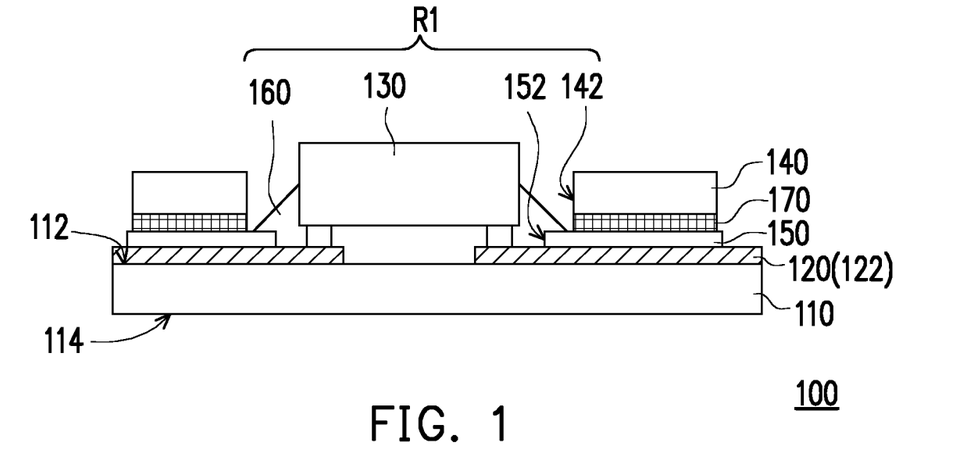
FIG. 1 illustrates a cross-sectional view of a chip on film package according to an embodiment of the disclosure.
Figure 2:
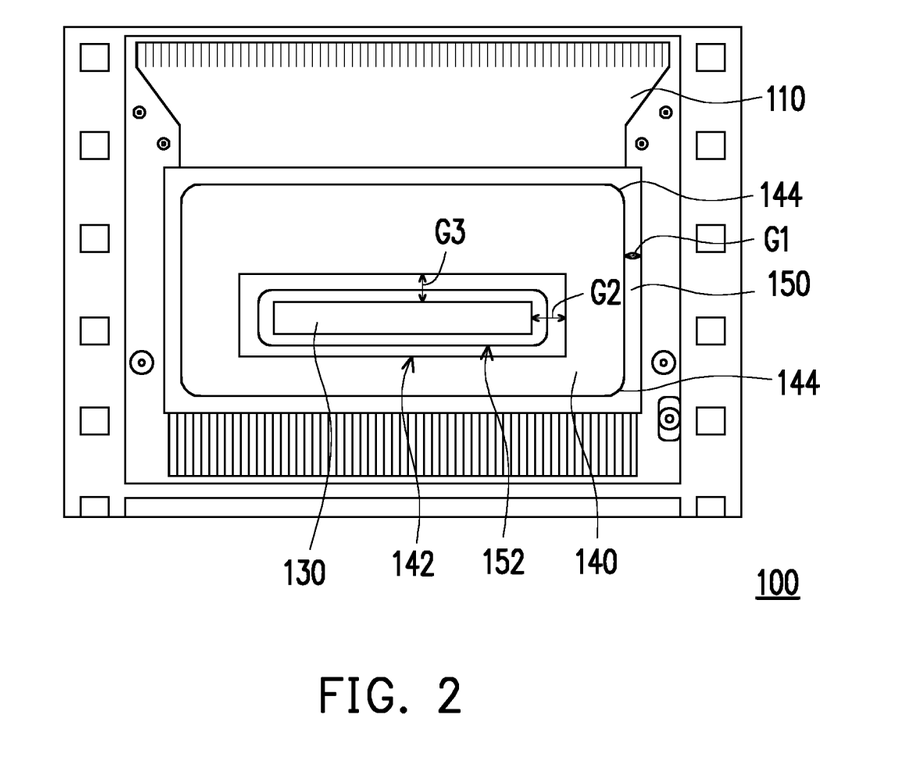
FIG. 2 illustrates a top view of a chip on film package according to an embodiment of the disclosure.

FIG. 1 illustrates a cross-sectional view of a chip on film package according to an embodiment of the disclosure. FIG. 2 illustrates a top view of a chip on film package according to an embodiment of the disclosure. Referring to FIG. 1 and FIG. 2, in some embodiments, the chip on film package 100 may include a base film 110, a patterned circuit layer 120, a chip 130 and a reinforcing sheet 140. The base film 110 includes a first surface 112, a second surface 114 opposite to the first surface and a mounting region R1 located on the first surface 112. In some embodiments, the base film 110 may include an insulating material such as, but not limited to, polyimide (PI). The patterned circuit layer 120 is disposed on the first surface 112. In some embodiments, the patterned circuit layer 120 is formed on the first surface 112 of the base film 110 by, for example, electroplating and etching processes, etc. The chip 130 may be mounted on the mounting region R1 by surface mount technology (SMT) and electrically connected to the patterned circuit layer 120. In some embodiments, the patterned circuit layer 120 may include a plurality of pads on which the chip 130 is mounted.

In some embodiments, the reinforcing sheet 140 is disposed on the first surface 112 and/or the second surface 114 and exposes the chip 130. In some embodiments, the reinforcing sheet 140 may be a flexible sheet and the flexibility of the reinforcing sheet 140 is substantially equal to or greater than the flexibility of the base film 110. In some embodiments, the material of the reinforcing sheet 140 may include PI, which includes a condensation product of an acid anhydride, a diamine compound, etc. The reinforcing sheet 140 may be laminated onto the first surface 112 and/or the second surface 114 of the base film by a laminating roller (e.g. the laminating roller 200 shown in FIG. 5 and FIG. 8). The thickness of the reinforcing sheet 140 may range from 3 μm to 40 μm. With such arrangement, the reinforcing sheet 140 is configured to provide flexibility and protection to the patterned circuit layer 120, so as to avoid fracture of fine circuit lines of the patterned circuit layer 120.

In one of the implementations, the reinforcing sheet 140 is disposed on the first surface 112 as shown in FIG. 1. The reinforcing sheet 140 may include a first opening 142 exposing the mounting region R1 and the chip 130 disposed on the mounting region R1. In some embodiments, the chip on film package 100 may further include a solder resist layer 150, which is disposed on the patterned circuit layer 120. The solder resist layer 150 may include a second opening 152 exposing a part of the patterned circuit layer 120 where the chip 130 is mounted. In such embodiments, the reinforcing sheet 140 is disposed on the solder resist layer 150 and the first opening 142 exposes the second opening 152 and a part of the solder resist layer 150 surround the second opening 152 as shown in FIG. 1.

In addition, the size of the reinforcing sheet 140 is substantially smaller than the size of the solder resist layer 150, and a gap G1 maintains between an outer edge of the reinforcing sheet 140 and an outer edge of the solder resist layer 150. In some embodiments, the chip on film package 100 may be formed by Reel to Reel production, so a plurality of chip on film packages 100 in a roll are singularized by punch process. In some embodiments, the reinforcing sheet 140 may be disposed within a punch lines of the chip on film package 100. Accordingly, when the chip on film package 100 is punched to be singularized, a gap may exist between the outer edge of the reinforcing sheet 140 and the outer edge (i.e. the punch line) of the chip on film package 100.

As such, the issue of the reinforcing sheet 140 peeling from the base film 110 can be reduced. Moreover, the reinforcing sheet 140 may further include a plurality of chamfered corners 144 as shown in FIG. 2 to further improve peeling issues of the reinforcing sheet 140.

In some embodiments, the chip on film package 100 further includes an underfill 160, which is disposed between the chip 130 and the base film 110 and covers the patterned circuit layer 120 exposed by the first opening 142. In some embodiments, the underfill 160 may be further filled between a side surface of the chip 130 and a side surface of the solder resist layer 150 exposed by the first opening 142 of the reinforcing sheet 140 as shown in FIG. 1. In the present embodiment, a gap exist between the side surface of the first opening 142 and the side surface of the chip 130. For example, the gap G2 may exist between the side surface of the first opening 142 and a short side surface of the chip 130, and the gap G3 may exist between another side surface of the first opening 142 and a long side surface of the chip 130 as shown in FIG. 2. Preferably but not limitedly, the width of the gap G2 may be substantially the same as the width of the gap G3. Alternatively, the width of the gap G2 may be different from the width of the gap G3.

In some embodiments, the chip on film package 100 may further include an adhesive layer 170, which is disposed between the reinforcing sheet 140 and the base film 110, such that the reinforcing sheet 140 is laminated and attached to the base film 110 via the adhesive layer 170. In some embodiments, the adhesive layer 170 may be omitted, and the reinforcing sheet 140 is laminated onto the base film 110 merely by applying pressure thereon. In some embodiments, the reinforcing sheet 140 is laminated onto the base film 110 by applying both heat and pressure thereon. Namely, the method of laminating the reinforcing sheet 140 onto the first surface 112 and/or the second surface 114 may further include a heating process. For example, the heating temperature of the heating process may range from 80° C. to 170° C., and the heating period of the heating process may range from 1 minute to 60 minutes. The present embodiment is merely for illustration, and the disclosure is not limited thereto.

Figure 2A:
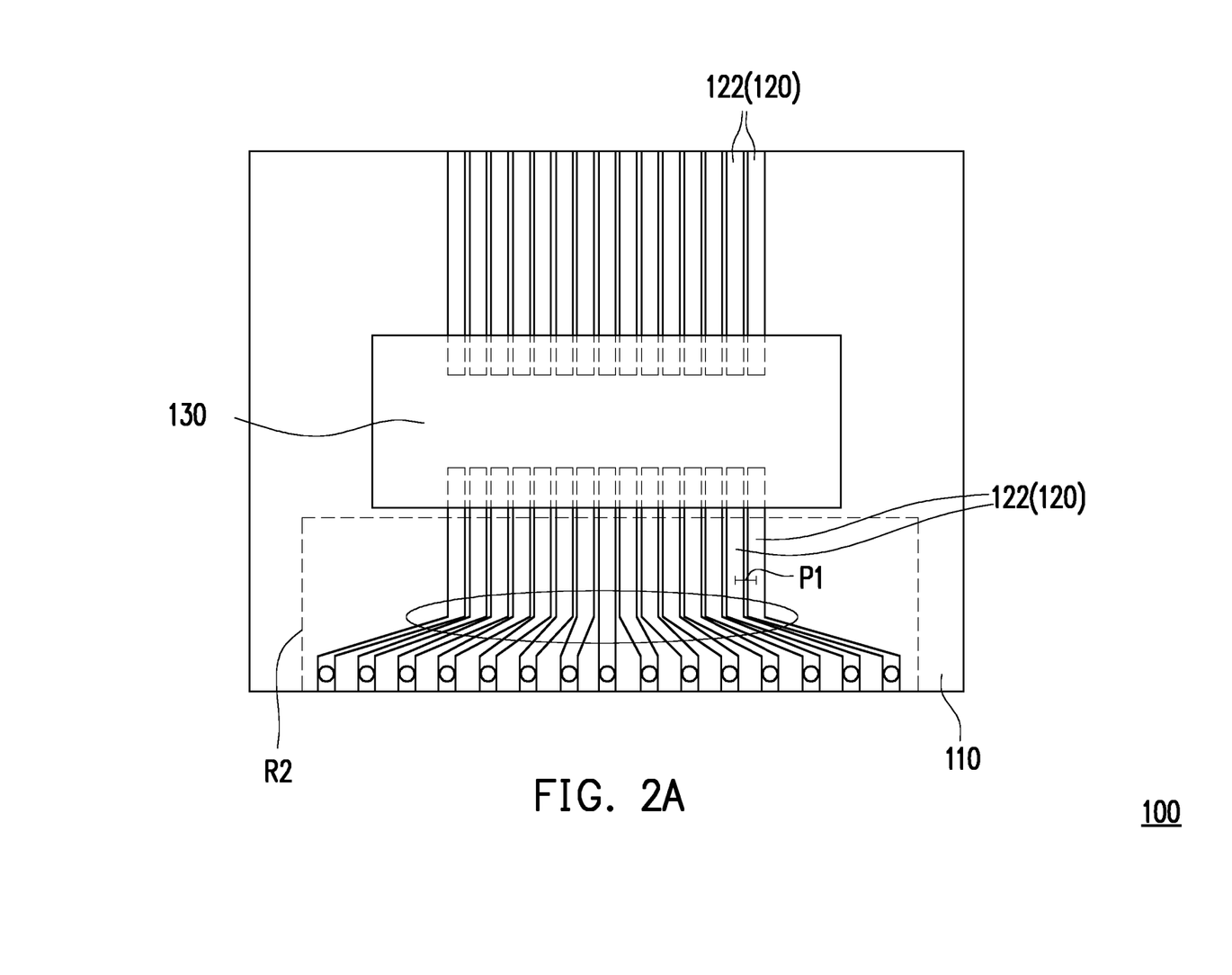
FIG. 2A illustrates a top view of a part of components of a chip on film package according to an embodiment of the disclosure.

FIG. 2A illustrates a top view of a part of components of a chip on film package according to an embodiment of the disclosure. It is noted that, for the sake of clarity and simplicity, the reinforcing sheet 140 and the solder resist layer 150 are omitted in FIG. 2A to better illustrate the layout of the patterned circuit layer 120. Referring to FIG. 1 and FIG. 2A, in some embodiments, the patterned circuit layer 120 may include a plurality of circuit lines 122 and a fine-pitch region R2. The fine-pitch region R2 has a first portion and a second portion, and the first portion is disposed closer to the chip 130 than the second portion. In the fine-pitch region R2, the density of the circuit lines 122 is high, so that a pitch P1 between adjacent two of the circuit lines 122 may be extremely fine. Accordingly, the width and the thickness of each circuit line 122 is also limited. For example, a pitch P1 between adjacent two of the circuit lines 122 in the first portion may be substantially smaller than 20 µm, a thickness of each of the circuit lines 122 may be less than 8 µm, a width of each of the circuit lines 122 may range from 5 µm to 11 µm, and the pitch in the second portion may be substantially greater than the pitch in the first portion. Therefore, the circuit lines 122 in the fine-pitch region R2 would be easily fractured due to lacking of mechanical strength. In such embodiments, the reinforcing sheet 140 at least covers the circuit lines 122 in the fine-pitch region R2 so as to protect the circuit lines 122 underneath and also provide flexibility to the circuit lines 122 and the base film 110. Accordingly, when the chip on film package 100 suffers impact or bending, the fracture of the circuit lines 122 in the fine-pitch region R2 can be significantly improved, so as to increase the yield rate of the chip on film package 100. In other embodiments, for similar purposes, the reinforcing sheet 140 may also covers the part of the base film 110 where circuit lines 122 turns in direction (e.g. the circled region in FIG. 2A).

Figure 3:
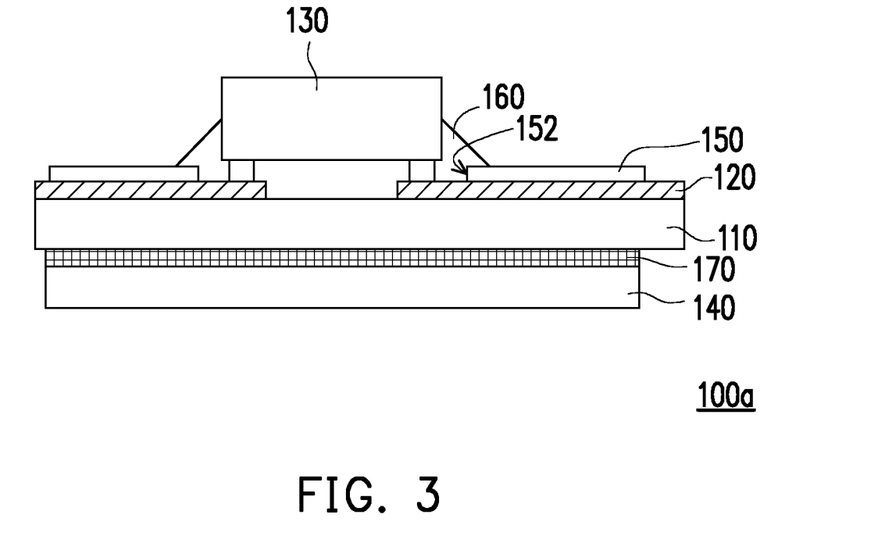
FIG. 3 illustrates a cross-sectional view of a chip on film package according to an embodiment of the disclosure.

FIG. 3 illustrates a cross-sectional view of a chip on film package according to an embodiment of the disclosure. It is noted that the chip on film package 100a shown in FIG. 3 contains many features same as or similar to the chip on film package 100 disclosed earlier with FIG. 1 to FIG. 2A. For purpose of clarity and simplicity, detail description of same or similar features may be omitted, and the same or similar reference numbers denote the same or like components. The main differences between the chip on film package 100a shown in FIG. 3 and the chip on film package 100 shown in FIG. 1 are described as follows.

Referring to FIG. 3, in some embodiments, the reinforcing sheet 140 is disposed on the second surface 114 of the base film 110. In the present embodiments, the reinforcing sheet 140 is laminated and attached to the base film 110 via the adhesive layer 170. In some embodiments, the adhesive layer 170 may be omitted, and the reinforcing sheet 140 is laminated onto the base film 110 merely by applying pressure thereon. In some embodiments, the method of laminating the reinforcing sheet 140 onto the second surface 114 may further include a heating process. For example, the heating temperature of the heating process may range from 80° C. to 170° C., and the heating period of the heating process may range from 1 minute to 60 minutes.

In some embodiments, the reinforcing sheet 140 may be disposed on the entire second surface 114 of the base film 110. In other embodiments, a gap may exist between the outer edge of the reinforcing sheet 140 and the outer edge (i.e. the punch line) of the chip on film package 100, so as to reduce the issue of the reinforcing sheet 140 peeling from the base film 110. Moreover, the reinforcing sheet 140 may further include a plurality of chamfered corners (similar to the chamfered corners 144 shown in FIG. 2) to further improve peeling issues of the reinforcing sheet 140. Alternatively, the reinforcing sheet 140 may be disposed on the region of the second surface 114 corresponding to the fine-pitch region R2 of the first surface 112, so as to provide flexibility to the circuit lines 122 and the base film 110. For example, the reinforcing sheet 140 may be disposed on the region of the second surface 114 right beneath the fine-pitch region R2 of the first surface 112. In other embodiments, the reinforcing sheet 140 may also be disposed on the region of the second surface 114 right beneath the circled region in FIG. 2A.

Figure 4:
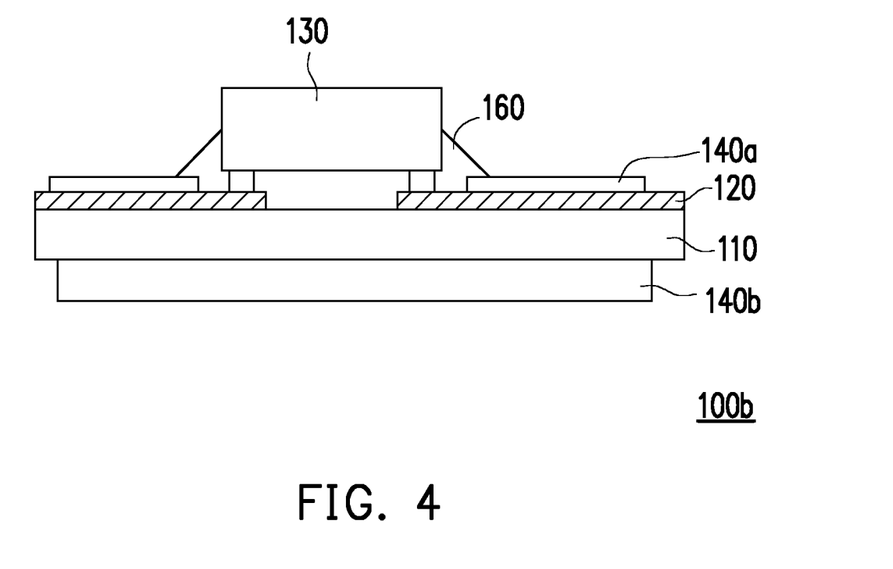
FIG. 4 illustrates a cross-sectional view of a chip on film package according to an embodiment of the disclosure.

FIG. 4 illustrates a cross-sectional view of a chip on film package according to an embodiment of the disclosure. It is noted that the chip on film package 100b shown in FIG. 4 contains many features same as or similar to the chip on film packages 100, 100a disclosed earlier with FIG. 1 to FIG. 3. For purpose of clarity and simplicity, detail description of same or similar features may be omitted, and the same or similar reference numbers denote the same or like components. The main differences between the chip on film package 100b shown in FIG. 4 and the chip on film packages 100, 100a shown in FIG. 1 to FIG. 3 are described as follows.

Referring to FIG. 4, in some embodiments, the reinforcing sheet 140 may include a first reinforcing sheet 140a disposed on the first surface 112 and a second reinforcing sheet 140b disposed on the second surface 114. The first reinforcing sheet 140a is directly disposed on the patterned circuit layer 120 and the first opening 142 exposes a part of the patterned circuit layer 120 where the chip 130 is mounted. Namely, in the present embodiments, the solder resist layer 150 is omitted and is replaced by the reinforcing sheet 140. The adhesive layer 170 is also omitted herein. Similarly, the second reinforcing sheet 140b is directly disposed on the second surface 114 without the help of the adhesive layer 170. In the present embodiment, the reinforcing sheets 140a, 140b are laminated onto the base film 110 merely by applying pressure thereon. In addition, the step of laminating the reinforcing sheets 140a, 140b onto the first surface 112 and the second surface 114 may further include a heating process. For example, the heating temperature of the heating process may range from, but not limited to, 80° C. to 170° C., and the heating period of the heating process may range from, but not limited to, 1 minute to 60 minutes.

Figure 5:
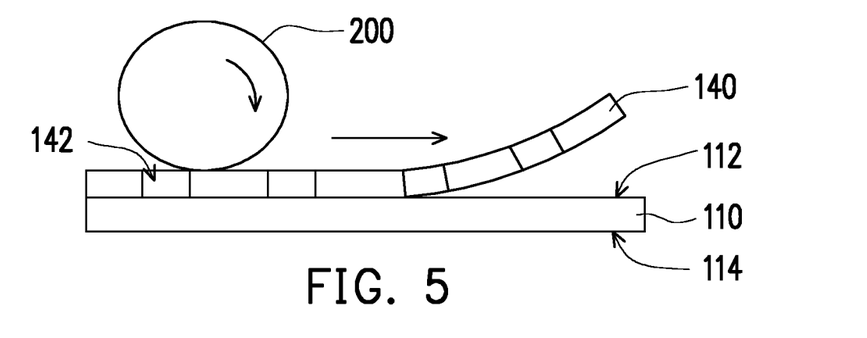
FIG. 5 and FIG. 6 illustrate a part of a manufacturing process of a chip on film packages according to embodiments of the disclosure.
Figure 6:
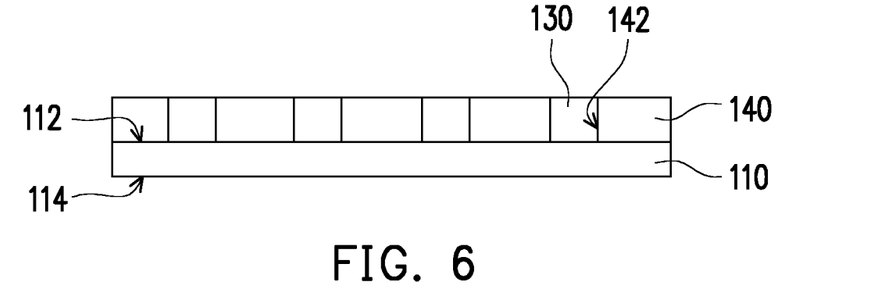

FIG. 5 and FIG. 6 illustrate a part of a manufacturing process of a chip on film packages according to embodiments of the disclosure. Referring to FIG. 1, FIG. 5 and FIG. 6, in some embodiments, the reinforcing sheet 140 may be laminated onto the first surface 112 and/or the second surface 114 before the chip is mounted on the mounting region R1. It is noted that the reinforcing sheet 140 being laminated onto the first surface 112 is depicted in FIG. 5 for illustration purpose, but the disclosure is not limited thereto. In other embodiments, the reinforcing sheet 140 may also be laminated onto the second surface 114. Accordingly, in the manufacturing process of the chip on film package 100/100a/100b, the base film 110 is firstly provided, and the patterned circuit layer 120 is then formed on the first surface 112 of the base film 110. In some embodiments, the solder resist layer 150 can be optionally formed on the patterned circuit layer 120. Next, the reinforcing sheet 140 is laminated onto the first surface 112 and/or the second surface 114 of the base film 110, and the chip 130 is then mounted on the mounting region R1 of the base film 110 to be electrically connected to the patterned circuit layer 120.

Referring to FIG. 5, in some embodiments, the reinforcing sheet 140 may include one or more first openings 142 (multiple first openings 142 are illustrated herein) corresponding to the mounting regions R1 of the base film 110. Then, the reinforcing sheet 140 including the first openings 142 is laminated onto the first surface 112 (and/or the second surface 114) by a laminating roller 200, which is configured to roll over the reinforcing sheet 140 on the first surface 112 and/or the second surface 114 to apply pressure evenly on the reinforcing sheet 140. For the embodiments of the reinforcing sheets 140a, 140b being laminated onto both the first surface 112 and the second surface 114, two laminating rollers 200 may be applied to both sides of the base film respectively to laminate the reinforcing sheets 140a, 140b onto the first surface 112 and the second surface 114 at the same time. In some embodiments, an adhesive layer (e.g. the adhesive layer 170 as shown in FIG. 1 and FIG. 3) may be formed on the first surface 112 and/or the second surface 114 before the reinforcing sheet 140 is laminated, but the disclosure is not limited thereto.

Then, referring to FIG. 6, one or more chips 130 (multiple chips 130 are illustrated herein) are disposed in the first openings 142 respectively to be mounted on the mounting regions R1 of the base film 110, and the chips 130 are electrically connected to the patterned circuit layer 120. Then, the resulting structure is punched to be singularized and form a plurality of chip on film packages 100/100a/100b as shown in FIG. 1, FIG. 3 or FIG. 4.

Figure 7:
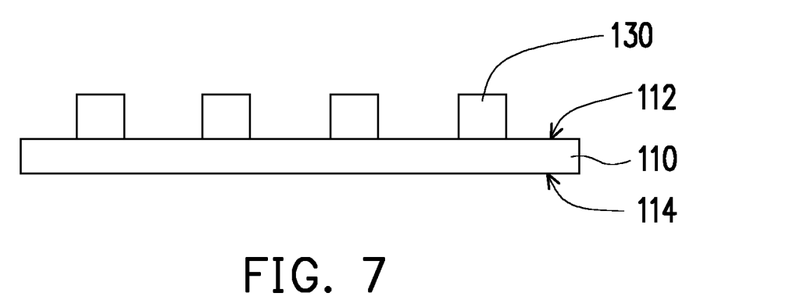
FIG. 7 and FIG. 8 illustrate a part of a manufacturing process of a chip on film packages according to embodiments of the disclosure.
Figure 8:
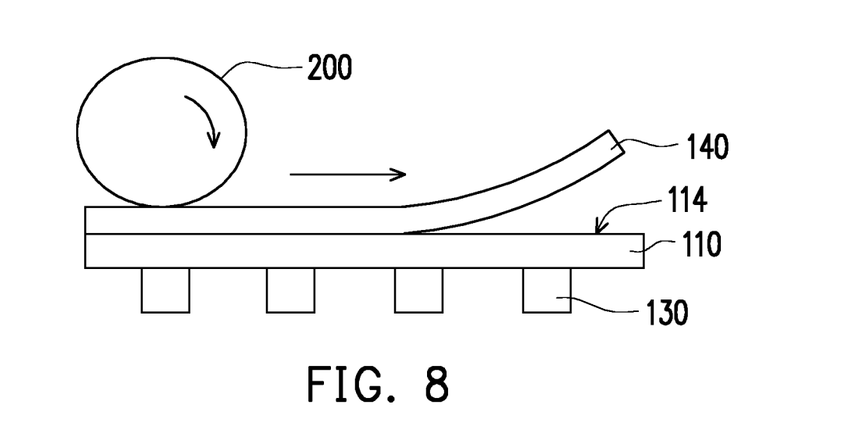

FIG. 7 and FIG. 8 illustrate a part of a manufacturing process of a chip on film packages according to embodiments of the disclosure. Referring to FIG. 3, FIG. 7 and FIG. 8, in the embodiments of the reinforcing sheet 140 being laminated onto the second surface 114, the reinforcing sheet 140 may be laminated onto the second surface 114 after the chip is mounted on the mounting region R1. Accordingly, in the manufacturing process of the chip on film package 100a, the base film 110 is firstly provided, and the patterned circuit layer 120 is then formed on the first surface 112 of the base film 110. In some embodiments, the solder resist layer 150 can be optionally formed on the patterned circuit layer 120. Next, the chip 130 is mounted on the mounting region R1 of the base film 110 to be electrically connected to the patterned circuit layer 120, and the reinforcing sheet 140 is then laminated onto the second surface 114 of the base film 110.

Referring to FIG. 7, in some embodiments, one or more chips 130 (multiple chips 130 are illustrated herein) are mounted on the mounting regions R1 of the base film 110 are electrically connected to the patterned circuit layer 120. Then, the reinforcing sheet 140 is laminated onto the second surface 114 by the laminating roller 200, which is configured to roll over the reinforcing sheet 140 on the second surface 114 to apply pressure evenly on the reinforcing sheet 140. In some embodiments, an adhesive layer (e.g. the adhesive layer 170 as shown in FIG. 1 and FIG. 3) may be formed on the second surface 114 before the reinforcing sheet 140 is laminated, but the disclosure is not limited thereto. Then, the resulting structure is punched to be singularized and form a plurality of chip on film packages 100a as shown in FIG. 3.

In sum, in the chip on film package of the disclosure, the reinforcing sheet is disposed on the first surface and/or the second surface of the base film and exposes the chip on the base film. The flexibility of the reinforcing sheet is substantially equal to or greater than the flexibility of the base film to provide flexibility and protection to the patterned circuit layer on the base film, so as to avoid fracture of fine circuit lines of the patterned circuit layer. In addition, the reinforcing sheet may be disposed at least on the region of the base film corresponding to the fine-pitch region of the patterned circuit layer to provide flexibility to the patterned circuit layer and the base film. Accordingly, when the chip on film package suffers impact or bending, the fracture of the patterned circuit layer in the fine-pitch region can be avoided. Therefore, yield rate of the chip on film package is significantly improved.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A chip on film package, comprising:
   a base film comprising a first surface, a second surface opposite to the first surface and a mounting region located on the first surface;
   a patterned circuit layer disposed on the first surface;
   a chip mounted on the mounting region and electrically connected to the patterned circuit layer; and
   a reinforcing sheet disposed on the first surface and/or the second surface and exposing the chip, wherein a flexibility of the reinforcing sheet is substantially greater than a flexibility of the base film, wherein the patterned circuit layer comprises a plurality of circuit lines and a fine-pitch region, and the reinforcing sheet at least covers the circuit lines in the fine-pitch region, and a pitch between adjacent two of the circuit lines in the fine-pitch region is substantially smaller than a pitch between adjacent two of the circuit lines in the rest of the patterned circuit layer and is substantially smaller than 20 μm, and a width of each of the circuit lines ranges from 5 μm to 11 μm.

2. The chip on film package according to claim 1, wherein the reinforcing sheet is disposed on the first surface and comprises a first opening exposing the chip.

3. The chip on film package according to claim 2, wherein the reinforcing sheet is directly disposed on the patterned circuit layer and the first opening exposes a part of the patterned circuit layer where the chip is mounted.

4. The chip on film package according to claim 2, further comprising a solder resist layer disposed on the patterned circuit layer and comprising a second opening exposing a part of the patterned circuit layer where the chip is mounted, the reinforcing sheet is disposed on the solder resist layer and exposes the second opening.

5. The chip on film package according to claim 4, wherein a size of the reinforcing sheet is substantially smaller than a size of the solder resist layer, and a gap maintains between an outer edge of the reinforcing sheet and an outer edge of the solder resist layer.

6. The chip on film package according to claim 2, further comprising an underfill disposed between the chip and the base film and covering the patterned circuit layer exposed by the first opening.

7. The chip on film package according to claim 1, wherein the reinforcing sheet is disposed on the second surface.

8. The chip on film package according to claim 1, wherein the reinforcing sheet comprises a plurality of chamfered corners.

9. The chip on film package according to claim 1, further comprising an adhesive layer disposed between the reinforcing sheet and the base film.

10. The chip on film package according to claim 1, wherein a material of the reinforcing sheet comprises polyimide (PI).

11. The chip on film package according to claim 1, wherein a thickness of the reinforcing sheet ranges from 3 μm to 40 μm.

12. A manufacturing method of a chip on film package, comprising:
providing a base film, wherein the base film comprises a first surface, a second surface opposite to the first surface and a mounting region located on the first surface;
forming a patterned circuit layer on the first surface, wherein the patterned circuit layer comprises a plurality of circuit lines and a fine-pitch region, and a pitch between adjacent two of the circuit lines in the fine-pitch region is substantially smaller than a pitch between adjacent two of the circuit lines in the rest of the patterned circuit layer and is substantially smaller than 20 μm, and a width of each of the circuit lines ranges from 5 μm to 11 μm;
mounting a chip on the mounting region, wherein the chip is electrically connected to the patterned circuit layer; and
laminating a reinforcing sheet onto the first surface and/or the second surface, wherein a flexibility of the reinforcing sheet is substantially greater than a flexibility of the base film, wherein the reinforcing sheet at least covers the circuit lines in the fine-pitch region.

13. The manufacturing method of the chip on film package according to claim 12, wherein the reinforcing sheet is laminated onto the first surface and/or the second surface before the chip is mounted on the mounting region, and the reinforcing sheet covers patterned circuit layer and exposing the mounting region.

14. The manufacturing method of the chip on film package according to claim 12, wherein the reinforcing sheet is laminated onto the second surface after the chip is mounted on the mounting region.

15. The manufacturing method of the chip on film package according to claim 12, wherein the reinforcing sheet is laminated onto the first surface and/or the second surface by a laminating roller configured to roll over the reinforcing sheet on the first surface and/or the second surface.

16. The manufacturing method of the chip on film package according to claim 12, the step of laminating the reinforcing sheet onto the first surface and/or the second surface further comprises a heating process.

17. The manufacturing method of the chip on film package according to claim 16, wherein a heating temperature of the heating process ranges from 80° C. to 170° C., and a heating period of the heating process ranges from 1 minute to 60 minutes.

18. The manufacturing method of the chip on film package according to claim 12, further comprising:
forming an adhesive layer on the first surface and/or the second surface before the reinforcing sheet is laminated onto the first surface and/or the second surface.

19. A chip on film package, comprising:
a base film comprising a first surface, a second surface opposite to the first surface and a mounting region located on the first surface;
a patterned circuit layer disposed on the first surface;
a chip mounted on the mounting region and electrically connected to the patterned circuit layer; and
a reinforcing sheet disposed on the first surface and/or the second surface and exposing the chip, wherein a flexibility of the reinforcing sheet is substantially greater than a flexibility of the base film,
wherein the patterned circuit layer comprises a plurality of circuit lines and a fine-pitch region, which has a first portion and a second portion, the pitch in the second portion is substantially greater than the pitch in the first portion, and the reinforcing sheet at least covers the circuit lines in the first portion, wherein the pitch between adjacent two of the circuit lines in the fine-pitch region is substantially smaller than 20 μm, and a width of each of the circuit lines ranges from 5 μm to 11 μm.

20. The chip on film package according to claim 19, wherein the first portion is disposed closer to the chip than the second portion.

21. The chip on film package according to claim 19, wherein the reinforcing sheet is disposed on the first surface and comprises a first opening exposing the chip.

22. The chip on film package according to claim 21, wherein the reinforcing sheet is directly disposed on the patterned circuit layer and the first opening exposes a part of the patterned circuit layer where the chip is mounted.

23. The chip on film package according to claim 21, further comprising a solder resist layer disposed on the patterned circuit layer and comprising a second opening exposing a part of the patterned circuit layer where the chip is mounted, the reinforcing sheet is disposed on the solder resist layer and exposes the second opening.

24. The chip on film package according to claim 23, wherein a size of the reinforcing sheet is substantially smaller than a size of the solder resist layer, and a gap maintains between an outer edge of the reinforcing sheet and an outer edge of the solder resist layer.

25. The chip on film package according to claim 19, wherein the reinforcing sheet is disposed on the second surface.

26. The chip on film package according to claim 19, wherein the reinforcing sheet comprises a plurality of chamfered corners.

27. The chip on film package according to claim 19, wherein a material of the reinforcing sheet comprises polyimide (PI).

28. The chip on film package according to claim 19, wherein a thickness of the reinforcing sheet ranges from 3 µm to 40 µm.

\* \* \* \* \*